(12) United States Patent
Pebay-Peyroula et al.

(10) Patent No.: US 8,800,878 B2
(45) Date of Patent: Aug. 12, 2014

(54) METHOD FOR ENCODING CONTACTLESS COMMUNICATION DATA FROM A TRANSPONDER TO A READER VIA CHARGE MODULATION, IN THE FORM OF A SET OF PATTERNS AND DEVICE FOR IMPLEMENTING SAME

(75) Inventors: Florian Pebay-Peyroula, Saint Nizier du Moucherot (FR); Elisabeth Crochon, Poisat (FR); Jacques Reverdy, Crolles (FR); Thierry Thomas, Varces Allieres et Risse (FR)

(73) Assignee: Commissariat a l'Energie Atomique et aux Energies Alternatives, Paris (FR)

( * ) Notice: Subject to any disclaimer, the term of this patent is extended or adjusted under 35 U.S.C. 154(b) by 0 days.

(21) Appl. No.: 13/502,491

(22) PCT Filed: Oct. 19, 2010

(86) PCT No.: PCT/EP2010/065736
§ 371 (c)(1),
(2), (4) Date: May 24, 2012

(87) PCT Pub. No.: WO2011/048107
PCT Pub. Date: Apr. 28, 2011

(65) Prior Publication Data
US 2012/0234928 A1  Sep. 20, 2012

(30) Foreign Application Priority Data
Oct. 19, 2009 (FR) ...................................... 09 05003

(51) Int. Cl.
*H04Q 5/22* (2006.01)
(52) U.S. Cl.
USPC .......................... 235/492; 340/10.1; 340/10.4

(58) Field of Classification Search
USPC ............... 235/451, 492; 340/10.1, 10.2, 10.3, 340/10.4
See application file for complete search history.

(56) References Cited

U.S. PATENT DOCUMENTS

| 6,028,503 A * | 2/2000 | Preishuberpflugl et al. . 340/10.4 |
| 6,422,476 B1 * | 7/2002 | Ackley ........................... 235/494 |

(Continued)

FOREIGN PATENT DOCUMENTS

| WO | WO 03/088499 | 10/2003 |
| WO | WO 2007/149219 | 12/2007 |

OTHER PUBLICATIONS

Jae-Min Seol et al., "Collision Resilient Multi-State Query Tree Protocol for Fast RFID Tag Identification," Computational Intelligence and Security; pp. 733-742 (2006) XP019098199.

(Continued)

*Primary Examiner* — Christopher Stanford
(74) *Attorney, Agent, or Firm* — Occhiuti & Rohlicek LLP

(57) ABSTRACT

The invention relates to a method for encoding contactless communication data from a transponder to a reader via charge modulation, in the form of a set of modulation patterns, each modulation pattern being a series of charge levels of a predefined length used for physical encoding, having a duration of n carrier periods ($T_c$), including a series of at least two charge levels, having a minimum pulse width (w) corresponding to the shortest duration of a single charge level in the pattern, and having a retromodulation rate (t) corresponding to the ratio between the retromodulation time and the duration of a pattern, characterized in that the number (k) of patterns is greater than four, the minimum pulse widths (w) of at least two patterns are different, and the retromodulation rates (t) of at least two patterns are different. The invention also relates to a device for implementing the method.

14 Claims, 5 Drawing Sheets

(56) References Cited

U.S. PATENT DOCUMENTS 6,954,496 B2 * 10/2005 Crochon et al. .............. 375/239
7,460,035 B1 12/2008 Ho et al.

OTHER PUBLICATIONS

Anonymous, "Radio-Frequency-Identification: types of RFID," retrieved from Internet: http://web.archive.org/web/20080731081210/http://www.rfid-handbook.de/rfid/types_of_rfid.html [retreived Apr. 26, 2010].

Sarma et al., "RFID Systems and Security and Privacy Implications," Lecture Notes in Computer Science, vol. 2523 (2003) XP002580190, retrieved from the Internet: http://saweis.net/pdfs/ches-rfid.pdf.

International Search Report, PCT Application No. PCT/EP2010/065736, mailed Dec. 21, 2010 (3 pages).

* cited by examiner

METHOD FOR ENCODING CONTACTLESS COMMUNICATION DATA FROM A TRANSPONDER TO A READER VIA CHARGE MODULATION, IN THE FORM OF A SET OF PATTERNS AND DEVICE FOR IMPLEMENTING SAME

CROSS-REFERENCE TO RELATED APPLICATIONS

This application is the National Stage of International Application No. PCT/EP2010/065736, filed on Oct. 19, 2010, which claims the benefit of the priority date of French Application No. 0905003, filed on Oct. 19, 2009. The content of these applications is hereby incorporated by reference in its entirety.

FIELD OF DISCLOSURE

The present invention relates generally to the technique of encoding data in the context of data interchanges between a reader or fixed base station and a contactless transponder (card, tag) placed in the electromagnetic field emitted by the reader.

More specifically, the invention relates to a method for encoding contactless communication data from a transponder to a reader by load modulation, in the form of a set of patterns and a device for implementing the method.

BACKGROUND

The electronic radiofrequency identification systems (RFID, radio frequency identification device) are being increasingly widely applied.

In fact, these systems are already these days widely used for identifying, locating or tracking objects, animals and people (access cards; tolls; electronic passports, etc.).

They generally comprise a reader and a transponder, for example integrated in a support such as a tag or a card. In the present invention, reference is made to passive transponders, that is to say, transponders that do not have their own energy source for transmitting data.

The reader, considered as a base station, generates a carrier wave (short range alternating magnetic field) which is used to power the contactless cards in proximity to the antenna of the reader. This process is called remote power feed. Furthermore, this carrier wave provides the card with a clock for the operation of its various blocks. Lastly, it serves as a medium for the reader-card and card-reader communications.

A distinction is made in the exchange of information between the base station and the transponder between the channel from the reader to the card and the channel from the card to the reader.

For the latter, a retromodulation (of amplitude or of phase) is applied by the passive transponder to the carrier by controlling a variable load, for example resistive or capacitive, at the terminals of the antenna of the card.

This switching provokes an armature reaction on the side of the reader, which can be demodulated and decoded to obtain the information stored in the card.

Hereinbelow, the term "symbol" is used to mean an element of a data encoding alphabet. A symbol may, for example, be a set of 3 bits, such as 011.

In the present context, the term "pattern or modulation pattern" is used to mean a succession of load levels of a predefined length used for the physical encoding, that is to say the retromodulation.

A pattern corresponds to a symbol and is characterized by its length and a succession of load levels.

First of all, the standard ISO 14 443 should be cited, which defines and allows for a communication between a reader and a card to be set up on the basis of a 13.56 MHz carrier ($f_c$) with a bit rate of between 106 kbits/s and 848 kbits/s. This standard proposes two retromodulation types (type A and type B), involving the notion of 848 kHz subcarrier ($f_{SC}=f_c/16$).

However, for certain applications, such as, for example, biometric identification or an electronic passport, this bit rate is not sufficient.

Various solutions have been proposed in order to increase the bit rate that can be achieved between the card and the reader.

A first approach proposed by the present Applicant consisted in increasing the frequency of the subcarrier to 1.7 Mbit/s ($f_{SC}=f_c/8$) and in modulating the phase of the subcarrier. Thus, bit rates of 1.7 Mbit/s and 3.4 Mbit/s were able to be achieved.

By moving away from the backdrop of the 848 kHz subcarrier frequency and by proposing a subcarrier frequency up to 27.12 MHz, other approaches have been able to achieve theoretical bit rates ranging up to 27.12 Mbits/s.

In more detail, a first obvious solution to this problem would consist in increasing the number of symbols.

The term "symbol" is used to mean the individual characters of an encoding alphabet. With a subcarrier from 848 kHz to 27.12 MHz and phase shifts $\Delta\phi$ of $\pi$, $\pi/2$, $\pi/4$, $\pi/8$, $\pi/16$, $\pi/32$, $\pi/64$ and $\pi/128$ makes it possible to cover a range of bit rates from 106 kbit/s to 27.12 Mbit/s.

A second obvious solution for increasing the bit rate with a constant number of symbols will consist in reducing the symbol time.

Thus, the symbols '0' and '1' are, for example, represented by a conventional Manchester code and the symbol time is variable. The bit rate is then equal to the subcarrier frequency.

In the case where the symbol time is equivalent to the period of the carrier at 13.56 MHz, there is therefore a bit rate of 13.56 Mbits/s.

However, it is observed that the bandwidth of the signals in base band increases very greatly with the bit rate, which hampers the recovery of the energy from the card and therefore embrittles its operation, and even reduces its range.

These two solutions which come naturally to the mind of those skilled in the art do not therefore address the problem posed.

Finally, a solution proposed for a UHF RFID application in the document WO2007/149219 is based, given constant symbol time, on a 16 QAM (Quadrature Amplitude Modulation) modulation, with two amplitude states and eight phase states.

However, this solution is complex to transpose to operation at 13.56 MHz, because, on the card side, it is necessary to be able to select both the retromodulation type and the value of the retromodulation load applied to the antenna.

The method described in this document makes it possible to encode a message m of n bits by simultaneously modulating the phase and the amplitude of a carrier frequency. With each n-bit message to be transmitted, a mapper (constellation diagram) associates a point of a complex plane.

However, this constellation diagram, which associates a phase and an amplitude of the carrier frequency, cannot be associated with modulation patterns.

The document WO 03/088499 relates to an encoding method between a reader and a passive transponder.

This solution proposes an encoding scheme in which n phases (n being an integer number) of a subcarrier are used to encode n bits in a time normally provided for 1 bit in a conventional encoding scheme.

Alternatively, this document proposes the use of different subcarriers instead of or in combination with the n phases.

With reference to FIG. 5 of this document, 3 bits are encoded per symbol either with eight subcarrier cycles for the symbols 1 to 4, or with six subcarrier cycles for the symbols 5 to 8.

Assuming an operation with a carrier frequency at 13.56 MHz and symbol time of $8/f_{SC}$ (subcarriers at 848 kHz and 636 kHz), it can be deduced therefrom that the bit rate achieved is only 318 kbits/s.

Moreover, the document U.S. Pat. No. 6,422,476 describes a data compression/decompression method for minimizing the memory size occupied by a character stream.

The character streams disclosed in this document are only symbols in the sense of this patent application, that is to say elements of an encoding alphabet.

This document does not in any way disclose modulation patterns which have to take account of the physical transmission of the data.

SUMMARY

The present invention aims to propose a data encoding method for the channel from the card to the reader which can ensure an increased data rate while preserving the bandwidth necessary for the remote power feed.

To this end, the present invention proposes a method for encoding contactless communication data from a transponder to a reader by load modulation, in the form of a set of modulation patterns, each pattern being a succession of load levels of a predefined length used for the physical encoding, and having a duration of n carrier periods ($T_c$), n being a number of carrier steps, comprising a succession of at least two load levels, having a minimum pulse width (w) corresponding to the shortest duration in terms of number of carrier steps of a same load level in the pattern, and having a retromodulation rate (t) corresponding to the ratio between the retromodulation time and the duration of a pattern, characterized in that the number (k) of patterns is greater than four, the minimum pulse widths (w) of at least two patterns are different, and the retromodulation rates (t) of at least two patterns are different.

The method may comprise one or more of the following features taken alone or in combination:

each pattern of the set of patterns encodes a number of bits p greater than or equal to 3, for the set of chosen patterns, the minimum pulse width ($w_{min}$) in terms of number of carrier steps is less than or equal to two, that is to say, among the set of chosen patterns each one having the pulse width, there is none for which the minimum pulse width ($w_{min}$) in terms of number of carrier steps less than or equal to two, for the set of chosen patterns, the average retromodulation rate (t) is less than 0.5, from the set of chosen patterns, there is at least one of the patterns which has a pulse with a width between one carrier period and ($n-2*w_{min}$) times carrier periods, and which has an edge which is in phase with one of the edges of the carrier and the pulse of the pattern is situated between the edge positioned at the index $w_{min}$ and the edge ($n-w_{min}$), $w_{min}$ being the minimum of the minimum pulse widths of the set of patterns.

the entropy of the set of patterns is strictly less than 1, the Hamming distance between two patterns of a set of patterns is greater than 2, the set of patterns is formed from a number of retromodulation levels greater than or equal to 3, at least one pattern of the set of patterns has a succession of load levels whose durations are less than $n/2/T_c$, in which $T_c$ is the period of the carrier, the carrier frequency is 13.56 MHz, n=8, and four patterns respectively have at least one pulse with a width of at least two carrier periods, two patterns respectively have two pulses separated by a width of two carrier periods, four patterns respectively have a pulse with a width of at least three carrier periods, offset by at least one carrier period relative to one another, twenty patterns respectively have two pulses separated by a width of at least one carrier period.

Another subject of the invention is a retromodulation device for implementing a method as defined above, characterized in that it comprises a shunt transistor and an n-bit carrier frequency shift register, the shunt transistor being arranged in series with the load impedance at the terminals of an antenna and whose gate is connected to the n-bit carrier frequency shift register, whose input is linked to a data line in parallel with the patterns to be transmitted, each modulation pattern being a succession of load levels of a predefined length used for the physical encoding and having a duration of n carrier periods, n being a number of carrier steps, comprising a succession of at least two load levels, having a minimum pulse width corresponding to the shortest duration in terms of number of carrier steps of a same load level in the pattern, and having a retromodulation rate corresponding to the ratio between the retromodulation time and the duration of a pattern, in which the number of patterns is greater than four, the minimum pulse widths of at least two patterns are different, and the retromodulation rates of at least two patterns are different.

Another subject of the invention is an RFID card comprising an antenna and a retromodulation device as defined above and a modulation control circuit for associating a list of symbols with modulation patterns.

Other advantages and features will become apparent from reading the description of the invention, and the following figures in which:

BRIEF DESCRIPTION OF THE FIGURES

Throughout the figures, identical elements are given the same reference numbers.

DETAILED DESCRIPTION

Hereinbelow, the term "symbol" is used to mean an element of a data encoding alphabet. A symbol may, for example, be a set of 3 bits, such as 011.

In the present context, the term "pattern or modulation pattern" is used to mean a succession of load levels of a predefined length used for the physical encoding, that is to say the retromodulation.

A modulation pattern corresponds to a symbol and is characterized by its length and a succession of load levels. It is used for the physical encoding of the data represented in symbol form.

The temporal representation of a pattern is the signal in base band, which is transposed to the carrier of a retromodulation load.

Figure 1:
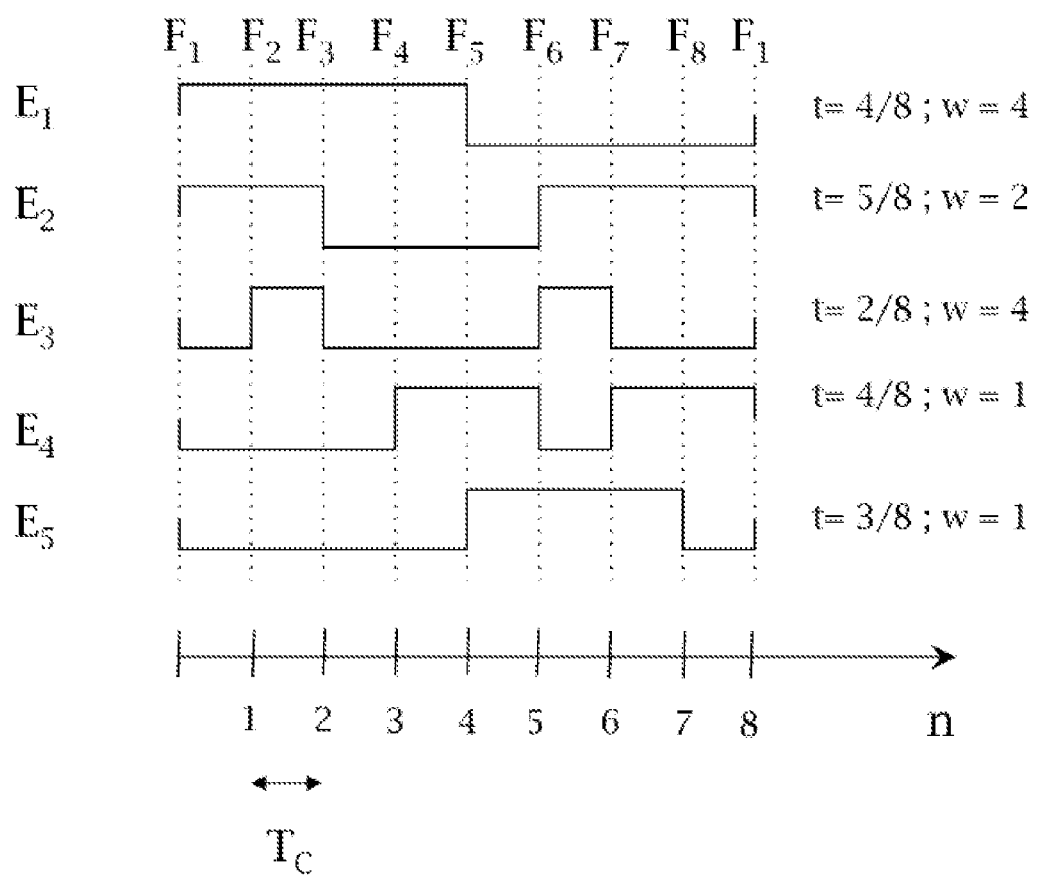
FIG. 1 is a diagram showing five encoding patterns as a function of time.

FIG. 1 is a diagram showing five encoding patterns $E_i$ (i=1 to 5) as a function of time.

The time scale is here represented as a function of the number of carrier periods $T_c$, also called number of carrier steps.

$T_c=1/f_c$, in which $f_c$ is the frequency of the carrier which is, for example, 13.56 MHz, in accordance with the standard ISO 14443.

The length of the patterns $T_{SC}$ is equal to $T_{SC}=n*T_c=n/f_c$ in which n is the number of carrier steps.

Throughout the explanation, n is a natural integer number. Obviously, it is easy to understand that n must have a value greater than or equal to 1, for example 2, 4, 5, 6, 7 or, for example, 8.

In the present example, n=8 has been chosen, but other pattern lengths can be envisaged.

In FIG. 1, the patterns represented $E_i$ (i=1 to 5), have two load levels, a low value or low level when the retromodulation load is not connected to the antenna and a high value or high level when the retromodulation load is connected to the antenna.

Obviously, it is also possible to envisage patterns formed with more load levels, for example three or more, which makes it possible to increase the number of bits encoded per pattern.

It should be recalled that when the transponder dissipates too much energy in its modulation load (that is to say, when the pattern is at the high level in the present example), it penalizes the recovery of energy.

Thus, it is possible to define a retromodulation rate t as follows:

t=r/n, in which r is the number (integer number) of carrier steps of a pattern during which the retromodulation load is activated.

This parameter is therefore between $0 \leq t \leq 1$ and as t approaches 1, increasingly more energy is dissipated in the retromodulation load $Z_R$, and the transponder has increasingly less energy to operate.

As an example, the retromodulation rates t of the patterns $E_i$ (i=1 to 5) are respectively 4/8, 5/8, 2/8, 4/8 and 3/8.

Another parameter characteristic of the patterns is the pulse width w which is linked to the bandwidth of the pattern.

The pulse width w is defined as the number of carrier steps of the minimum pulse width (high or low load level) that a pattern can contain.

As an example, the pulse widths w of the patterns $E_i$ (i=1 to 5) are respectively 4, 2, 1, 1 and 1.

The pulse width w is linked to the bandwidth of the pattern and makes it possible to quantify the bandwidth for the communication. The bandwidth BP is at most inversely proportional to the pulse width w. Consequently, the greater the pulse width w, the narrower the bandwidth and the greater the ability of the transponder to recover, via the antenna, energy necessary to its operation.

To determine the bit rate, it is also necessary to know the number of bits p (p being a natural integer number) encoded per pattern.

Thus, if the aim is to encode symbols of three bits (000, 001, 010, . . . , 111), it is necessary to have a set of $2^3=8$ patterns.

The bit rate obtained is calculated as follows: $d=(p*f_c)/n$.

The principle of the invention consists in doing away with the simple or phase-shifted subcarriers and in defining sets of patterns used to encode binary symbols that have a high average pulse width w (therefore a narrow bandwidth) and a low average retromodulation rate (therefore making it possible to reduce the dissipation of the energy in the retromodulation load $Z_R$).

Figure 2:
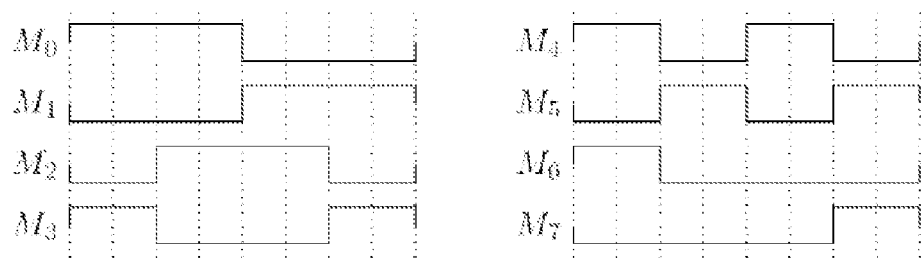
FIG. 2 is a diagram showing a set of 8 patterns according to the invention.
Figure 3:
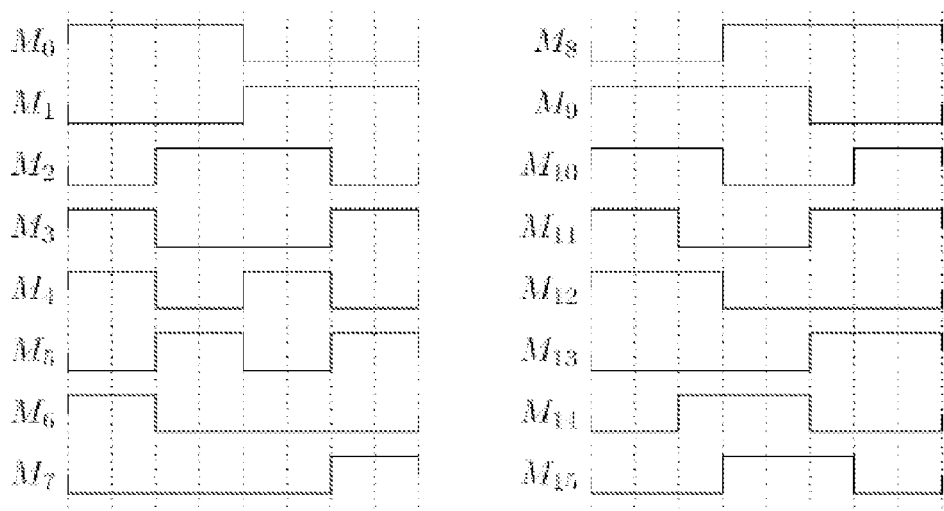
FIG. 3 is a diagram showing a set of 16 patterns according to the invention.
Figure 4:
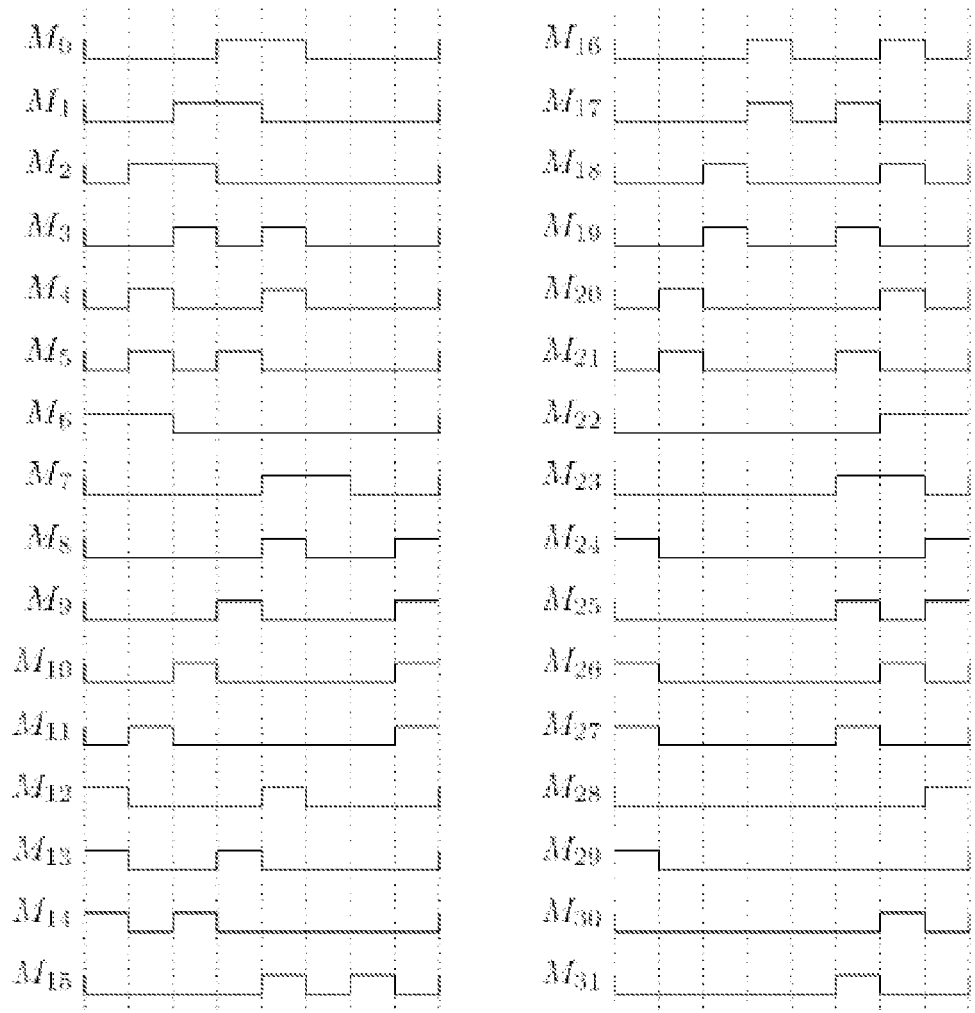
FIG. 4 is a diagram showing a set of 32 patterns according to the invention.

FIGS. 2, 3 and 4 respectively represent sets of 8, 16 and 32 modulation patterns according to the invention.

For each of the sets of patterns, the length n in terms of carrier period is n=8.

The invention applies only for a set containing more than four patterns (k>4, k being an integer number).

As can be seen in FIGS. 2 to 4, each pattern comprises a succession of at least two load levels. Obviously, it is possible to envisage having more, for example three load levels.

Consequently, the patterns of FIGS. 2, 3 and 4 can be characterized as follows:

TABLE 1

Characteristics of the patterns of FIG. 2

|  | t | w |
|---|---|---|
| $M_0$ | 4/8 | 4 |
| $M_1$ | 4/8 | 4 |
| $M_2$ | 4/8 | 2 |
| $M_3$ | 4/8 | 2 |
| $M_4$ | 4/8 | 2 |
| $M_5$ | 4/8 | 2 |
| $M_6$ | 2/8 | 2 |
| $M_7$ | 2/8 | 2 |

For the set of patterns of FIG. 2, p=3 and there are therefore $2^3=8$ patterns. Obviously, it is not necessary for the number of patterns to be a number which is a power of the digit 2, that is to say 2, 4, 8, etc.

It can be seen for Table 1:

$t_{avg}=0.4375$ $w_{max}=4; w_{min}=2.$

Thus, for this set of patterns of FIG. 2, where p=3 (3 bits encoded per pattern), it is possible to achieve a downlink bit rate of 5.1 Mbits/s with a carrier of 13.56 MHz.

TABLE 2

Characteristics of the patterns of FIG. 3

|     | t   | w |
| --- | --- | --- |
| $M_0$ | 4/8 | 4 |
| $M_1$ | 4/8 | 4 |
| $M_2$ | 4/8 | 2 |
| $M_3$ | 4/8 | 2 |
| $M_4$ | 4/8 | 2 |
| $M_5$ | 4/8 | 2 |
| $M_6$ | 2/8 | 2 |
| $M_7$ | 2/8 | 2 |
| $M_8$ | 5/8 | 3 |
| $M_9$ | 5/8 | 3 |
| $M_{10}$ | 5/8 | 2 |
| $M_{11}$ | 5/8 | 2 |
| $M_{12}$ | 3/8 | 3 |
| $M_{13}$ | 3/8 | 3 |
| $M_{14}$ | 3/8 | 2 |
| $M_{15}$ | 3/8 | 2 |

For the set of patterns of FIG. 3, p=4 and there are therefore $2^4$=16 patterns.

It is found that:

$t_{avg}$=0.46875

$w_{max}$=4; $w_{min}$=2.

Thus, for this set of patterns of FIG. 3, where p=4 (4 bits encoded per pattern), it is possible to achieve a downlink bit rate of 6.78 Mbits/s with a carrier of 13.56 MHz.

TABLE 3

Characteristics of the patterns of FIG. 4

|     | t   | w |
| --- | --- | --- |
| $M_0$ | 2/8 | 2 |
| $M_1$ | 2/8 | 2 |
| $M_2$ | 2/8 | 2 |
| $M_3$ | 2/8 | 1 |
| $M_4$ | 2/8 | 1 |
| $M_5$ | 2/8 | 1 |
| $M_6$ | 2/8 | 2 |
| $M_7$ | 2/8 | 2 |
| $M_8$ | 2/8 | 1 |
| $M_9$ | 2/8 | 1 |
| $M_{10}$ | 2/8 | 1 |
| $M_{11}$ | 2/8 | 1 |
| $M_{12}$ | 2/8 | 1 |
| $M_{13}$ | 2/8 | 1 |
| $M_{14}$ | 2/8 | 1 |
| $M_{15}$ | 2/8 | 1 |
| $M_{16}$ | 2/8 | 1 |
| $M_{17}$ | 2/8 | 1 |
| $M_{18}$ | 2/8 | 1 |
| $M_{19}$ | 2/8 | 1 |
| $M_{20}$ | 2/8 | 1 |
| $M_{21}$ | 2/8 | 1 |
| $M_{22}$ | 2/8 | 2 |
| $M_{23}$ | 2/8 | 2 |
| $M_{24}$ | 2/8 | 1 |
| $M_{25}$ | 2/8 | 1 |
| $M_{26}$ | 2/8 | 1 |
| $M_{27}$ | 2/8 | 1 |
| $M_{28}$ | 1/8 | 1 |
| $M_{29}$ | 1/8 | 1 |
| $M_{30}$ | 1/8 | 1 |
| $M_{31}$ | 1/8 | 1 |

For the set of patterns of FIG. 4, p=5 and there are therefore $2^5$=32 patterns.

It is found that:

$t_{avg}$=0.2344

$w_{max}$=2; $w_{min}$=1.

Thus, for this set of patterns of FIG. 3, where p=5 (5 bits encoded per pattern), it is possible to achieve a downlink bit rate of 8.5 Mbits/s with a carrier of 13.56 MHz.

As can be seen in the figures and in tables 1 to 3, for each of the sets presented as a nonlimiting example, the minimum pulse widths, that is to say w, of at least two patterns are different, and the retromodulation rates t of at least two patterns are different.

If the bandwidth is to be narrowed, it has proven shrewd to have the minimum pulse width w not less than one.

In order to ensure an effective remote power feed, the minimum pulse width, that is to say w, is proportional to the inverse of the bandwidth of the antenna of the transponder.

To best exploit the field emitted by a reader and improve the recovery of energy by the transponder, a choice is made for the average retromodulation rate $t_{avg}$ to be less than 0.5 for the set of patterns chosen, as is the case in the examples of FIGS. 2 to 4.

In the examples presented, out of the set of chosen patterns, there is at least one of the patterns which has a pulse width of between 1 and (n−2*$w_{min}$) times carrier periods and which has an edge F which is in phase with one of the edges of the carrier. This pulse of the pattern is situated between the edge number $w_{min}$ and the edge (n−$w_{min}$), $w_{min}$ being the minimum of the minimum pulse widths of the set of patterns, which improves the transmission security in the sequencing of the patterns.

FIG. 1 shows, as an indication, the edges $F_1$, $F_2$ to $F_8$. It should be noted that, by convention, the last edge of a pattern belongs to the next pattern.

For FIG. 1, $w_{min}$=1. It can be seen that the pattern $E_4$ has a pulse of width w=2 which has an edge $F_4$ in phase with the edge of the carrier (dotted lines) and which is situated between the edge $w_{min}$, that is to say the edge $F_1$, and the edge n−$w_{min}$, that is to say $F_7$.

The set of patterns chosen has an entropy strictly less than 1.

The entropy is calculated according to the following formula:

$$H_b(X) = -E[\log_b P(X = x_i)] = \sum_{i=1}^{n} P_i \log_b\left(\frac{1}{P_i}\right) = -\sum_{i=1}^{n} P_i \log_b P_i.$$

in which

X is the source of information to base b, which delivers n load levels, each load level having a probability of appearance of Pi.

In the present examples of FIGS. 2 to 4, this means:

FIG. 2: H=0.98
FIG. 3: H=0.997
FIG. 4: H=0.798

This relationship characterizes the dispersion/heterogeneity of the patterns contributing to the increase in bit rate.

Another characteristic that makes it possible to secure the transmission of the data relates to the Hamming distance. In practice, it is possible to choose the Hamming distance between two patterns of a set of patterns greater than 2.

Then, the set of patterns is constructed so that at least one pattern of the set of patterns has a succession of load levels whose durations are less than n/2*$T_c$, in which $T_c$ is the period of the carrier.

More specifically, for the examples of the figures in which n=8, four patterns respectively have at least one pulse with a width of at least two carrier periods (w=2).

Furthermore, in the set of patterns, two patterns respectively have two pulses separated by a width of two carrier periods.

Regarding the example of FIG. 3, the set of patterns is also characteristic in the fact that four patterns ($M_{12}$, $M_{13}$, $M_{14}$, $M_{15}$) respectively have a pulse with a width of least three carrier periods, offset by at least one carrier period relative to one another.

With regard to the example of FIG. 4, twenty patterns respectively have two pulses separated by a width of at least one carrier period ($M_3$, $M_4$, $M_5$, $M_8$, $M_9$, $M_{10}$, $M_{11}$, $M_{12}$, $M_{13}$, $M_{14}$, $M_{15}$, $M_{16}$, $M_{17}$, $M_{18}$, $M_{18}$, $M_{20}$, $M_{21}$, $M_{25}$, $M_{26}$, $M_{27}$).

Figure 5:
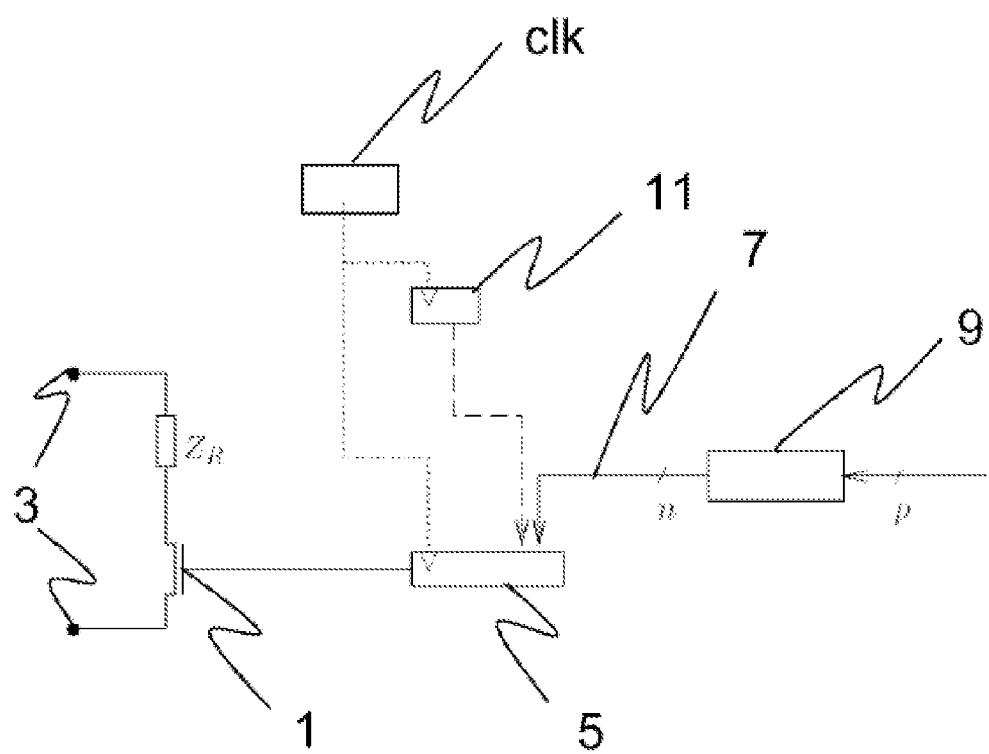
FIG. 5 is a retromodulation device for implementing the method according to the invention.

The method for encoding contactless communication data from a transponder to a reader by load modulation, in the form of a set of patterns can be implemented using a device presented by a block diagram in FIG. 5.

FIG. 5 therefore presents a retromodulation device, for example in the form of a circuit which comprises a shunt transistor 1 arranged in series with the load impedance $Z_R$ at the terminals 3 of an antenna. The gate of the transistor 1 is connected to an n-bit carrier frequency ($f_c$) shift register 5. The register 5 can therefore contain a pattern of length n.

The input of the register 5 is linked to a data line 7 in parallel with the patterns to be transmitted from a modulation control circuit 9 in order to associate a list of symbols with the modulation patterns.

The register 5 is paced by a clock clk on each carrier period. This clock also paces a "0 to n" counter 11 which, each time the counter 11 has the value "0", causes the register to be reset.

The circuit operates as follows:

The clock clk paces, on the one hand, the register 5 and, on the other hand, the counter 11.

On each clock period, the output of the shift register 5 presents the current value of the bit of the pattern which directly controls the gate of the transistor 1. Thus, if the bit is "0", the retromodulation load $Z_R$ is not connected to the terminals of the antenna 3, whereas, if the bit is "1", the retromodulation load $Z_R$ is connected to the terminals of the antenna 3 and "overwrites" the field emitted by the reader.

It will therefore be understood that the present invention allows for a considerable increase in the bit rate between a transponder and a reader while observing the bandwidth of the antenna and the activation time of the retromodulation load to ensure the power supply for the passive transponder.

To complement the drawings, the following tables are a binary transcription ("0"—retromodulation load deconnected; "1"—retromodulation load connected) of the sets of patterns of FIGS. 2 to 4.

TABLE 4

Binary transcription of the patterns of FIG. 2

|  | $1*T_c$ | $2*T_c$ | $3*T_c$ | $4*T_c$ | $5*T_c$ | $6*T_c$ | $7*T_c$ | $8*T_c$ |
|---|---|---|---|---|---|---|---|---|
| $M_0$ | 1 | 1 | 1 | 1 | 0 | 0 | 0 | 0 |
| $M_1$ | 0 | 0 | 0 | 0 | 1 | 1 | 1 | 1 |
| $M_2$ | 0 | 0 | 1 | 1 | 1 | 1 | 0 | 0 |
| $M_3$ | 1 | 1 | 0 | 0 | 0 | 0 | 1 | 1 |
| $M_4$ | 1 | 1 | 0 | 0 | 1 | 1 | 0 | 0 |
| $M_5$ | 0 | 0 | 1 | 1 | 0 | 0 | 1 | 1 |
| $M_6$ | 1 | 1 | 0 | 0 | 0 | 0 | 0 | 0 |
| $M_7$ | 0 | 0 | 0 | 0 | 0 | 0 | 1 | 1 |

TABLE 5

Binary transcription of the patterns of FIG. 3

|  | $1*T_c$ | $2*T_c$ | $3*T_c$ | $4*T_c$ | $5*T_c$ | $6*T_c$ | $7*T_c$ | $8*T_c$ |
|---|---|---|---|---|---|---|---|---|
| $M_0$ | 1 | 1 | 1 | 1 | 0 | 0 | 0 | 0 |
| $M_1$ | 0 | 0 | 0 | 0 | 1 | 1 | 1 | 1 |
| $M_2$ | 0 | 0 | 1 | 1 | 1 | 1 | 0 | 0 |
| $M_3$ | 1 | 1 | 0 | 0 | 0 | 0 | 1 | 1 |
| $M_4$ | 1 | 1 | 0 | 0 | 1 | 1 | 0 | 0 |
| $M_5$ | 0 | 0 | 1 | 1 | 0 | 0 | 1 | 1 |
| $M_6$ | 1 | 1 | 0 | 0 | 0 | 0 | 0 | 0 |
| $M_7$ | 0 | 0 | 0 | 0 | 0 | 0 | 1 | 1 |
| $M_8$ | 0 | 0 | 0 | 1 | 1 | 1 | 1 | 0 |
| $M_9$ | 1 | 1 | 1 | 1 | 1 | 0 | 0 | 0 |
| $M_{10}$ | 1 | 1 | 1 | 0 | 0 | 0 | 1 | 1 |
| $M_{11}$ | 1 | 1 | 0 | 0 | 0 | 1 | 1 | 1 |
| $M_{12}$ | 1 | 1 | 1 | 0 | 0 | 0 | 0 | 0 |
| $M_{13}$ | 0 | 0 | 0 | 0 | 0 | 1 | 1 | 1 |
| $M_{14}$ | 0 | 0 | 1 | 1 | 1 | 0 | 0 | 0 |
| $M_{15}$ | 0 | 0 | 0 | 1 | 1 | 1 | 0 | 0 |

TABLE 6

Binary transcription of the patterns of FIG. 4

|  | $1*T_c$ | $2*T_c$ | $3*T_c$ | $4*T_c$ | $5*T_c$ | $6*T_c$ | $7*T_c$ | $8*T_c$ |
|---|---|---|---|---|---|---|---|---|
| $M_0$ | 0 | 0 | 0 | 1 | 1 | 0 | 0 | 0 |
| $M_1$ | 0 | 0 | 1 | 1 | 0 | 0 | 0 | 0 |
| $M_2$ | 0 | 1 | 1 | 0 | 0 | 0 | 0 | 0 |
| $M_3$ | 0 | 0 | 1 | 0 | 1 | 0 | 0 | 0 |
| $M_4$ | 0 | 1 | 0 | 0 | 1 | 0 | 0 | 0 |
| $M_5$ | 0 | 1 | 0 | 1 | 0 | 0 | 0 | 0 |
| $M_6$ | 1 | 1 | 0 | 0 | 0 | 0 | 0 | 0 |
| $M_7$ | 0 | 0 | 0 | 0 | 1 | 1 | 0 | 0 |
| $M_8$ | 0 | 0 | 0 | 0 | 1 | 0 | 0 | 1 |
| $M_9$ | 0 | 0 | 0 | 1 | 0 | 0 | 0 | 1 |
| $M_{10}$ | 0 | 0 | 1 | 0 | 0 | 0 | 0 | 1 |
| $M_{11}$ | 0 | 1 | 0 | 0 | 0 | 0 | 0 | 1 |
| $M_{12}$ | 1 | 0 | 0 | 0 | 1 | 0 | 0 | 0 |
| $M_{13}$ | 1 | 0 | 0 | 1 | 0 | 0 | 0 | 0 |
| $M_{14}$ | 1 | 0 | 1 | 0 | 0 | 0 | 0 | 0 |
| $M_{15}$ | 0 | 0 | 0 | 0 | 1 | 0 | 1 | 0 |
| $M_{16}$ | 0 | 0 | 0 | 1 | 0 | 0 | 1 | 0 |
| $M_{17}$ | 0 | 0 | 0 | 1 | 0 | 1 | 0 | 0 |
| $M_{18}$ | 0 | 0 | 1 | 0 | 0 | 0 | 1 | 0 |
| $M_{19}$ | 0 | 0 | 1 | 0 | 0 | 1 | 0 | 0 |
| $M_{20}$ | 0 | 1 | 0 | 0 | 0 | 0 | 1 | 0 |
| $M_{21}$ | 0 | 1 | 0 | 0 | 0 | 1 | 0 | 0 |
| $M_{22}$ | 0 | 0 | 0 | 0 | 0 | 0 | 1 | 1 |
| $M_{23}$ | 0 | 0 | 0 | 0 | 0 | 1 | 1 | 0 |
| $M_{24}$ | 1 | 0 | 0 | 0 | 0 | 0 | 0 | 1 |
| $M_{25}$ | 0 | 0 | 0 | 0 | 0 | 1 | 0 | 1 |
| $M_{26}$ | 1 | 0 | 0 | 0 | 0 | 0 | 1 | 0 |
| $M_{27}$ | 1 | 0 | 0 | 0 | 0 | 1 | 0 | 0 |
| $M_{28}$ | 0 | 0 | 0 | 0 | 0 | 0 | 0 | 1 |
| $M_{29}$ | 1 | 0 | 0 | 0 | 0 | 0 | 0 | 0 |
| $M_{30}$ | 0 | 0 | 0 | 0 | 0 | 0 | 1 | 0 |
| $M_{31}$ | 0 | 0 | 0 | 0 | 0 | 1 | 0 | 0 |

A table of binary transcription ("0"—retromodulation load disconnected; "1"—retromodulation load connected) for n=6 is given below as an example.

TABLE 7

Binary transcription of patterns for n = 6

|  | $1*T_c$ | $2*T_c$ | $3*T_c$ | $4*T_c$ | $5*T_c$ | $6*T_c$ |
|---|---|---|---|---|---|---|
| $M_0$ | 1 | 1 | 1 | 0 | 0 | 0 |
| $M_1$ | 0 | 0 | 1 | 1 | 0 | 0 |

TABLE 7-continued

Binary transcription of patterns for n = 6

|     | 1 * $T_c$ | 2 * $T_c$ | 3 * $T_c$ | 4 * $T_c$ | 5 * $T_c$ | 6 * $T_c$ |
| --- | --- | --- | --- | --- | --- | --- |
| $M_2$ | 0 | 0 | 0 | 0 | 1 | 1 |
| $M_3$ | 0 | 0 | 0 | 1 | 1 | 1 |

It can be seen for this set of 4 patterns:

$t_{avg}=0.4167$ and $w_{min}=2$. The entropy is, in this case, H=0.979.

Figure 6:
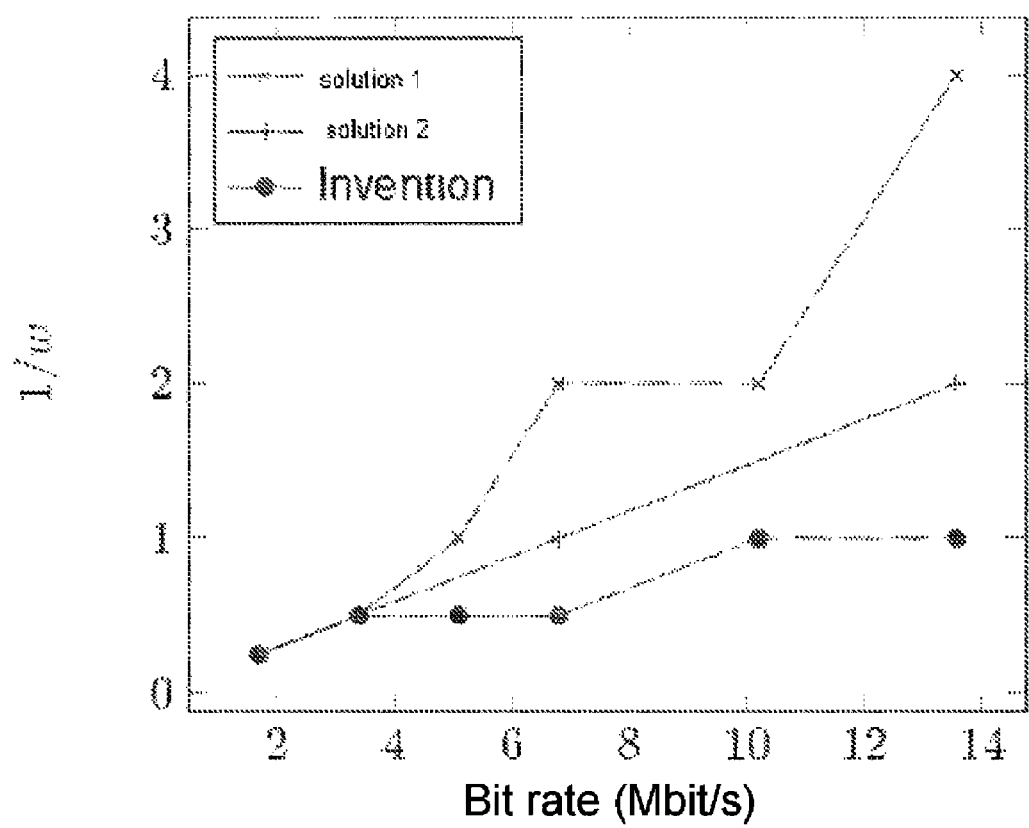
FIG. 6 shows a graph of the trend of the parameter 1/w which is proportional to the bandwidth as a function of the bit rate for obvious approaches and for the solution according to the invention.

FIG. 6 shows, on a graph, the trend of the parameter 1/w which is proportional to the bandwidth as a function of the bit rate for obvious approaches and for the solution according to the invention.

The solutions 1 and 2 respectively correspond to the obvious solutions described in the introduction consisting in increasing the number of symbols or reducing the symbol time.

It can be seen that the solution according to the invention offers a wide distinction and allows for a significant increase in the bit rate while keeping a restricted bandwidth, ensuring that the recovery of energy is safeguarded over time.

The invention claimed is:

1. A method for encoding contactless communication data from a transponder to a reader by load modulation, in the form of a set of modulation patterns, said method comprising associating, with each symbol from a data encoding alphabet, a modulation pattern, thereby defining a list of elements, each element of said list having a symbol and a modulation pattern selected from said set of modulation patterns, causing said transponder to select each pattern in said set of modulation patterns to be a succession of load levels of a predefined length used for physical encoding and to have a duration equal to the product of a carrier period and a number of carrier steps, to comprise a succession of at least two load levels, to have a minimum pulse width corresponding to a shortest duration in terms of number of carrier steps of a same load level in the pattern, and to have a retromodulation rate corresponding to a ratio between the retromodulation time and the duration of a pattern, wherein the number of patterns is greater than four, the minimum pulse widths of at least two patterns are different, and the retromodulation rates of at least two patterns are different, said method further comprising identifying a symbol representing information to be transmitted, using said list, identifying a modulation pattern corresponding to said symbol, and transmitting a signal that encodes said modulation pattern.

2. The method of claim 1, wherein each pattern of the set of patterns encodes a number of bits greater than or equal to three.

3. The method of claim 1, wherein, for the set of patterns, the minimum pulse width in terms of number of carrier steps is less than or equal to two.

4. The method of claim 1, wherein, for the set of patterns, the average retromodulation rate is less than 0.5.

5. The method of claim 1, wherein, from the set of patterns, at least one pattern has a pulse with a width between one carrier period and (n−2*$w_{min}$) times the carrier period, and which has an edge that is in phase with an edge of the carrier, and the pulse of the pattern is situated between the edge positioned at the index $w_{min}$ and the edge (n−$w_{min}$), $w_{min}$ being the minimum of the minimum pulse widths of the set of patterns, and n is the number of carrier periods.

6. The method of claim 1, wherein the entropy of the set of patterns is strictly less than one.

7. The method of claim 1, wherein the Hamming distance between two patterns of the set of patterns is greater than two.

8. The method of claim 1, wherein the set of patterns is formed from a number of retromodulation levels greater than or equal to three.

9. The method of claim 1, wherein at least one pattern of the set of patterns has a succession of load levels whose durations are less than one-half the duration.

10. The method of claim 1, wherein the communication relies on a carrier having a carrier frequency of 13.56 megahertz.

11. The method of claim 10, wherein the number of carrier steps is eight, and wherein four patterns respectively have at least one pulse with a width of at least two carrier periods.

12. The method of claim 10, wherein two patterns respectively have two pulses separated by a width of two carrier periods.

13. The method of claim 10, wherein four patterns respectively have a pulse with a width of at least three carrier periods and are offset by at least one carrier period relative to one another.

14. The method of claim 10, wherein twenty patterns respectively have two pulses separated by a width of at least one carrier period.

* * * * *